United States Patent
Ong et al.

(10) Patent No.: US 7,859,098 B2
(45) Date of Patent: Dec. 28, 2010

(54) EMBEDDED INTEGRATED CIRCUIT PACKAGE SYSTEM

(75) Inventors: You Yang Ong, Singapore (SG); Dioscoro A. Merilo, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 548 days.

(21) Appl. No.: 11/379,332

(22) Filed: Apr. 19, 2006

(65) Prior Publication Data

US 2007/0246806 A1    Oct. 25, 2007

(51) Int. Cl.
*H01L 23/04* (2006.01)

(52) U.S. Cl. .................... 257/698; 257/778; 438/108; 438/126

(58) Field of Classification Search ................. 257/698, 257/787, 796, 778; 438/108, 126
See application file for complete search history.

(56) References Cited

U.S. PATENT DOCUMENTS

| | | | |
|---|---|---|---|
| 6,232,152 B1 * | 5/2001 | DiStefano et al. | 438/124 |
| 6,369,455 B1 * | 4/2002 | Ho et al. | 257/796 |
| 6,740,964 B2 * | 5/2004 | Sasaki | 257/687 |
| 6,759,268 B2 * | 7/2004 | Akagawa | 438/106 |
| 6,798,057 B2 | 9/2004 | Bolkin et al. | |
| 6,998,703 B2 | 2/2006 | Di Stefano | |
| 7,185,426 B1 * | 3/2007 | Hiner et al. | 29/841 |
| 2004/0070083 A1 | 4/2004 | Su | |
| 2005/0098879 A1 | 5/2005 | Kim | |
| 2005/0110168 A1 | 5/2005 | Chuang | |
| 2005/0224988 A1 | 10/2005 | Tuominen | |
| 2006/0145331 A1 * | 7/2006 | Cho et al. | 257/700 |
| 2007/0246813 A1 | 10/2007 | Ong et al. | |

* cited by examiner

*Primary Examiner*—Trung Dang
(74) *Attorney, Agent, or Firm*—Mikio Ishimaru

(57) ABSTRACT

An embedded integrated circuit package system is provided forming a first conductive pattern on a first structure, connecting a first integrated circuit die on the first conductive pattern, forming a substrate forming encapsulation to cover the first integrated circuit die and the first conductive pattern, forming a channel in the substrate forming encapsulation, and applying a conductive material in the channel.

17 Claims, 6 Drawing Sheets

EMBEDDED INTEGRATED CIRCUIT PACKAGE SYSTEM

CROSS-REFERENCE TO RELATED APPLICATIONS

The present application contains subject matter related to concurrently filed U.S. patent application Ser. No. 11/379, 336. The related application is assigned to STATS ChipPAC Ltd. and is hereby incorporated by reference thereto.

1. Technical Field

The present invention relates generally to a substrate and more particularly to a substrate with integrated circuits.

2. Background Art

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice, package in package (PIP), package on package (POP), or a combination thereof. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction. Conventional PIP and POP configurations require space for the package integration and/or stack limiting the reduction of the package height.

Numerous approaches embed passive devices and integrated circuit circuits into printed circuit board. Some of these approaches require lamination and press process in conventional printed circuit board manufacturing causing damage to the integrated circuits or limiting the thinness of the integrated circuits. Other approaches embed integrated circuits in holes formed in the printed circuit board or substrate. However, these approaches have problems such as different materials used for filling the hole from the substrate causing damage to the integrated circuit, embedded connections to the integrated circuits, additional process steps to form connections to the embedded integrated circuit, or a combination thereof.

Thus, a need still remains for an embedded integrated circuit package system for ultra thin integrated circuits providing low cost manufacturing, improved yields, and reduction the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an embedded integrated circuit package system including forming a first conductive pattern on a first structure, connecting a first integrated circuit die on the first conductive pattern, forming a substrate forming encapsulation to cover the first integrated circuit die and the first conductive pattern, forming a channel in the substrate forming encapsulation, and applying a conductive material in the channel.

Certain embodiments of the invention have other aspects in addition to or in place of those mentioned or are obvious from the above. The aspects will become apparent to those skilled in the art from a reading of the following detailed description when taken with reference to the accompanying drawings.

BEST MODE FOR CARRYING OUT THE INVENTION

Figure 1:
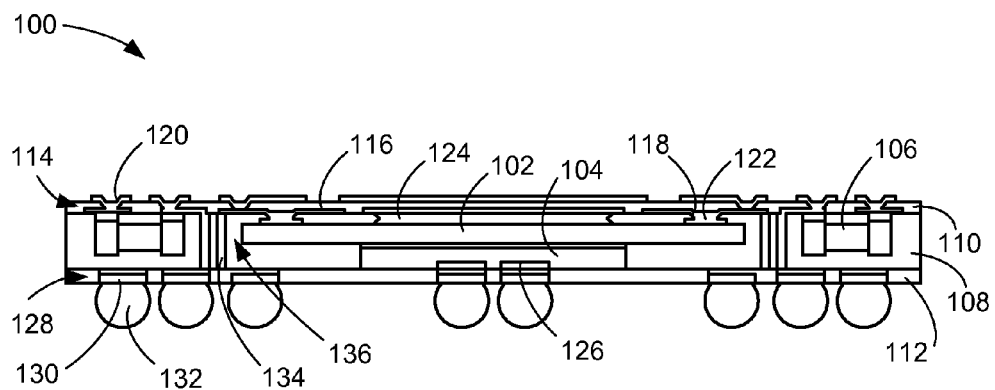
FIG. 1 is a cross-sectional view of a first embedded integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a first embedded integrated circuit package system 100 in an embodiment of the present invention. The first embedded integrated circuit package system 100 embeds devices, such as a first integrated circuit die 102, a second integrated circuit die 104, and components 106 in a substrate forming encapsulation 108 between a first structure 110 and a second structure 112.

The first structure 110, such as a fiber reinforced substrate or a bismaleimide triazine (BT) substrate, has a first conductive pattern 114, such as a patterned thin copper (Cu) foil, thereon. The first conductive pattern 114 includes traces 116 for routing signals and contacts 118 for mounting devices. First terminal pads 120 are exposed connecting to the first conductive pattern 114 through the first structure 110.

The first integrated circuit die 102, such as an ultra thin processor die, includes bumps 122 on a first active side, wherein the bumps 122 connect on the contacts 118. The first conductive pattern 114 also connects to the interior portion of the first active side forming a support 124 while serving a number of functions, such as supporting the first integrated circuit die 102 to withstand a stacking process, dissipating heat from the first integrated circuit die 102, or providing an electromagnetic (EM) shield. The support 124 may optionally include an adhesive between the first conductive pattern 114 and the first integrated circuit die 102. The components 106, such as discrete passive components, also connect on the contacts 118. The second integrated circuit die 104, such as an ultra thin memory die, stack on the first integrated circuit die 102. A second non-active side of the second integrated circuit die 104 attaches on a first non-active side of the first integrated circuit die 102 with an adhesive, such as a low CTE die-attach adhesive. A second active side of the second integrated circuit die 104 has central bond pads 126 thereon.

For illustrative purpose, the bumps 122 of the first integrated circuit die 102 are shown on peripheral bond pads, although it is understood the first integrated circuit die 102 may have bond pads in a different configuration, such as an array or a central configuration. Also for illustrative purpose, the second integrated circuit die 104 is shown having the central bond pads 126, although it is understood that the bond pads may be in a different configuration, such as a peripheral or a central configuration. Further for illustrative purpose, the first integrated circuit die 102 is shown larger than the second integrated circuit die 104, although it is understood that the relative sizes may differ.

The first integrated circuit die 102, the components 106, and the second integrated circuit die 104 are embedded and covered in the substrate forming encapsulation 108, such as a substrate forming encapsulation having low coefficient of thermal expansion (CTE). The substrate forming encapsulation 108 may be made from a low CTE encapsulant, such an epoxy with a negative CTE filler of zirconium tungstate ($ZrW_2O_8$), halfnium tungstate ($HfW_2O_8$) or a solution of zirconium and halfnium tungstate ($Z_{0.5}Hf_{0.5}W_2O_8$). The low CTE encapsulant may also be a composite with an epoxy and a conventional nonconductive filler, such as silica. The low CTE encapsulant is not electrically conductive and may in a liquid form having the viscosity allowing mold injection or needle dispensing. The composition of the low CTE encapsulant may be adjusted to lessen CTE mismatches avoiding damage to the embedded devices and the other portions of the first embedded integrated circuit package system 100.

The second structure 112, having a second conductive pattern 128, is on the substrate forming encapsulation 108. A predetermined portion of the second conductive pattern 128 is exposed through the second structure 112 to ambient forming second terminal pads 130 and the substrate forming encapsulation 108. The central bond pads 126 are also exposed to ambient forming a portion part of the second terminal pads 130. External interconnects 132, such as solder balls, attach to the second terminal pads 130 for connection to the next system level (not shown), such as a printed circuit board or another integrated circuit device. Electrical vias 134, formed in channels 136, connect the first conductive pattern 114 and the second conductive pattern 128 in a predetermined configuration. The electrical vias 134 may be designed to also form vertical shields surrounding or isolating certain devices in the substrate forming encapsulation 108.

Figure 2:
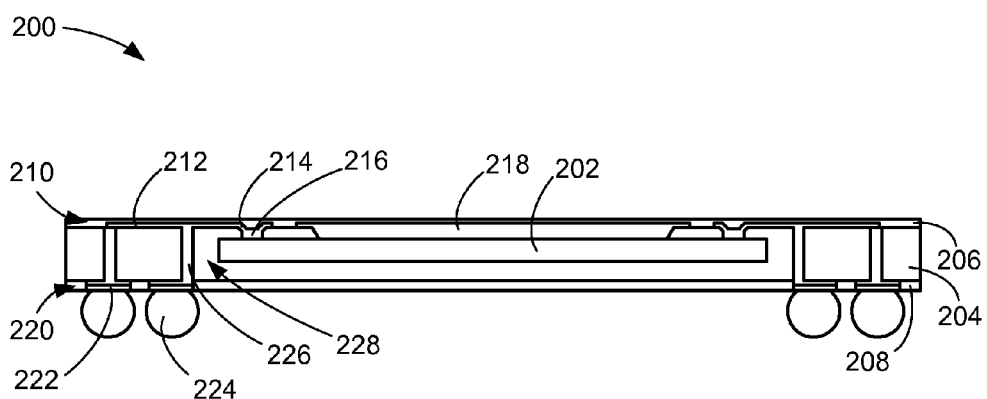
FIG. 2 is a cross-sectional view of a second embedded integrated circuit package system in an alternative embodiment of the present invention.

Referring now to FIG. 2, therein is shown a cross-sectional view of a second embedded integrated circuit package system in an alternative embodiment of the present invention. A second embedded integrated circuit package system 200 embeds devices, such as an integrated circuit die 202, in a substrate forming encapsulation 204 between a first structure 206 and a second structure 208.

The first structure 206, such as a fiber reinforced substrate or a bismaleimide triazine (BT) substrate, has a first conductive pattern 210. The first conductive pattern 210 includes traces 212 for routing signals and contacts 214 for mounting devices.

The integrated circuit die 202 includes bumps 216 on an active side, wherein the bumps 216 connect on the contacts 214. The first conductive pattern 210 also connects to the interior portion of the active side forming a support 218 while serving a number of functions, such as dissipating heat from the integrated circuit die 202 or providing an electromagnetic (EM) shield. The support 218 may optionally include an adhesive between the first conductive pattern 210 and the integrated circuit die 202.

The integrated circuit die 202 is embedded and covered in the substrate forming encapsulation 204, such as a substrate forming encapsulation having low coefficient of thermal expansion (CTE). The substrate forming encapsulation 204 may be made from a low CTE encapsulant.

The second structure 208, having a second conductive pattern 220, is on the substrate forming encapsulation 204. A predetermined portion of the second conductive pattern 220 is exposed through the second structure 208 to ambient forming terminal pads 222 and the substrate forming encapsulation 204. External interconnects 224, such as solder balls, attach to the terminal pads 222 for connection to the next system level (not shown), such as a printed circuit board or another integrated circuit device. Electrical vias 226, formed in channels 228, connect the first conductive pattern 210 and the second conductive pattern 220 in a predetermined configuration.

Figure 3:
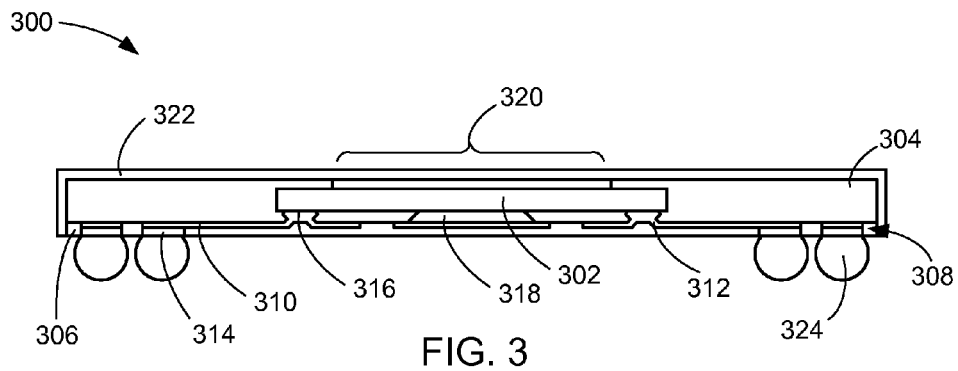
FIG. 3 is a cross-sectional view of a third embedded integrated circuit package system in another alternative embodiment of the present invention.

Referring now to FIG. 3, therein is shown a cross-sectional view of a third embedded integrated circuit package system 300 in another alternative embodiment of the present invention. The third embedded integrated circuit package system 300 embeds devices, such as an integrated circuit die 302, in a substrate forming encapsulation 304.

A structure 306, having a conductive pattern 308, is on the substrate forming encapsulation 304. The conductive pattern 308 includes traces 310 for routing signals and contacts 312 for mounting devices. A predetermined portion of the conductive pattern 308 is exposed through the structure 306 to ambient forming terminal pads 314.

The integrated circuit die 302 includes bumps 316 on an active side, wherein the bumps 316 connect on the contacts 312. The conductive pattern 308 also connects to the interior portion of the active side forming a support 318 while serving a number of functions, such as dissipating heat from the integrated circuit die 302 or providing an electromagnetic (EM) shield. The support 318 may optionally include an adhesive between the conductive pattern 308 and the integrated circuit die 302.

The integrated circuit die 302 is embedded and covered in the substrate forming encapsulation 304 with a portion of a non-active side of the integrated circuit die 302 exposed through an opening 320 in the substrate forming encapsulation 304. A heat slug 322 attaches to the non-active side and surrounds the substrate forming encapsulation 304 except the side with the structure 306. The conductive pattern 308 may connect the heat slug 322 to ground forming an EM shield with the heat slug 322. External interconnects 324, such as solder balls, attach to the terminal pads 314 for connection to the next system level (not shown), such as a printed circuit board or another integrated circuit device.

Figure 4:
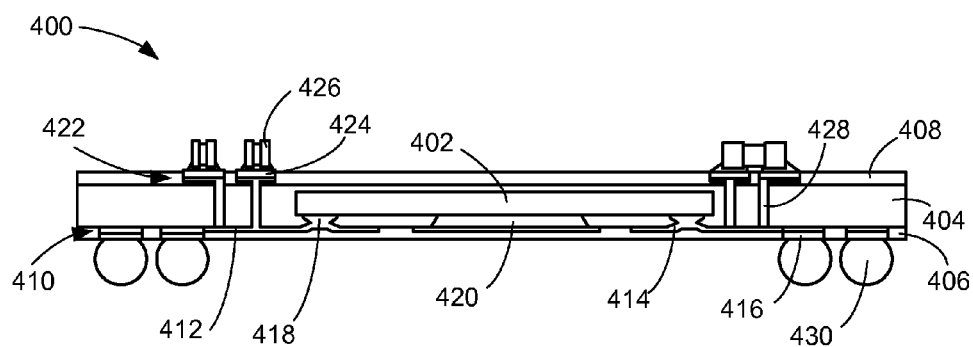
FIG. 4 is a cross-sectional view of a fourth embedded integrated circuit package system in yet another alternative embodiment of the present invention.

Referring now to FIG. 4, therein is shown a cross-sectional view of a fourth embedded integrated circuit package system 400 in yet another alternative embodiment of the present invention. The fourth embedded integrated circuit package system 400 embeds devices, such as an integrated circuit die 402, in a substrate forming encapsulation 404 between a first structure 406 and a second structure 408.

The first structure 406 has a first conductive pattern 410, wherein the first conductive pattern 410 includes traces 412 for routing signals and contacts 414 for mounting devices. A predetermined portion of the first conductive pattern 410 is exposed through the first structure 406 to ambient forming first terminal pads 416.

The integrated circuit die 402 includes bumps 418 on an active side, wherein the bumps 418 connect on the contacts 414. The first conductive pattern 410 also connects to the interior portion of the active side forming a support 420 while serving a number of functions, such as dissipating heat from the integrated circuit die 402 or providing an electromagnetic (EM) shield. The support 420 may optionally include an adhesive between the first conductive pattern 410 and the integrated circuit die 402.

The second structure 408, having a second conductive pattern 422, is on the substrate forming encapsulation 404. A predetermined portion of the second conductive pattern 422 is exposed through the second structure 408 to ambient forming second terminal pads 424 and the substrate forming encapsulation 404. Components 426 connect to the second terminal pads 424. Electrical vias 428, formed in channels 430, connect the first conductive pattern 410 and the second conductive pattern 422 in a predetermined configuration. External interconnects 432, such as solder balls, attach to the first terminal pads 416 for connection to the next system level (not shown), such as a printed circuit board or another integrated circuit device.

Figure 5:
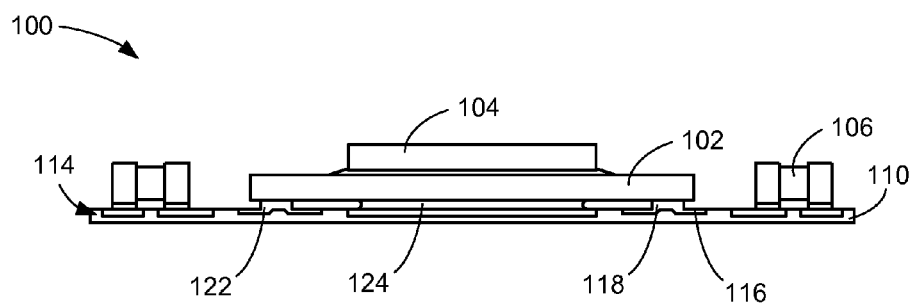
FIG. 5 is a cross-sectional view of the first embedded integrated circuit package system of FIG. 1 in a device-attach phase.

Referring now to FIG. 5, therein is shown a cross-sectional view of the first embedded integrated circuit package system 100 of FIG. 1 in a device-attach phase. The first structure 110 has the first conductive pattern 114 thereon. The first conductive pattern 114 includes the traces 116 for routing signals, the contacts 118 for mounting devices, and the support 124 for the first integrated circuit die 102. The first integrated circuit die 102 mounts on the first conductive pattern 114 with the bumps 122 connected on the contacts 118, and is then cured. The first conductive pattern 114 also connects to the interior portion of the first integrated circuit die 102. The second integrated circuit die 104 attaches on the first integrated circuit die 102 with the support 124 minimizing warpage or damage to the first integrated circuit die 102, and is then cured. The components 106 mount on the first conductive pattern 114 on the contacts 118 then cured.

Figure 6:
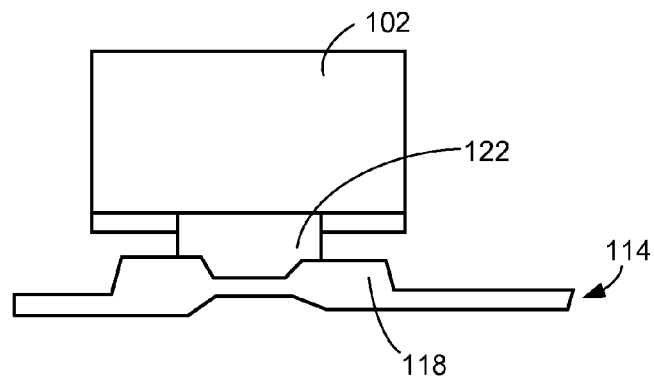
FIG. 6 is a more detailed view of the connection on the first conductive pattern of FIG. 5.

Referring now to FIG. 6, therein is shown a more detailed view of the connection on the first conductive pattern 114 of FIG. 5. The more detailed view depicts one of the bumps 122, such as copper pillar bumps, of the first integrated circuit die 102 attached to the one of the contacts 118.

Figure 7:
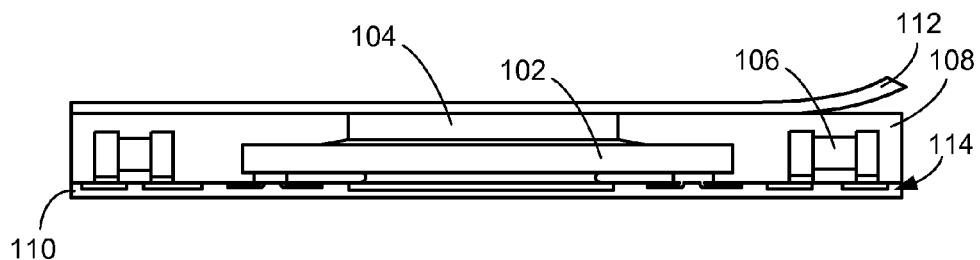
FIG. 7 is the structure of FIG. 6 in a substrate forming encapsulation phase.

Referring now to FIG. 7, therein is the structure of FIG. 6 in a substrate forming encapsulation phase. The low CTE encapsulant, the liquid substrate, flows to surround and cover the first integrated circuit die 102, the second integrated circuit die 104, the components 106, and the first conductive pattern 114 on the first structure 110 forming the substrate forming encapsulation 108. The second structure 112, such as a top patterned substrate lamination, attaches on the substrate forming encapsulation 108.

Figure 8:
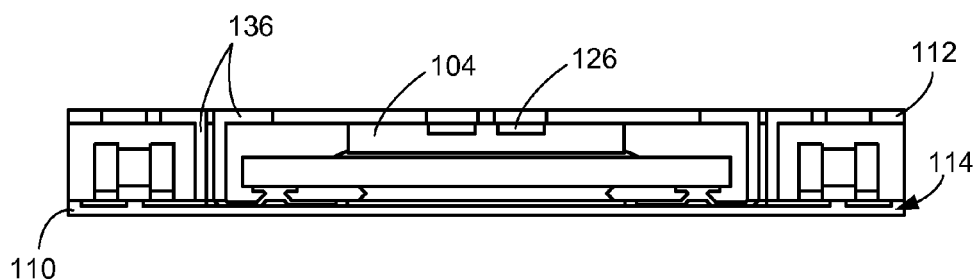
FIG. 8 is the structure of FIG. 7 in a drilling phase.

Referring now to FIG. 8, therein is the structure of FIG. 7 in a drilling phase. A laser drill forms the channels 136 from the second structure 112 to the first conductive pattern 114, in the second structure 112, through the first structure 110 to the first conductive pattern 114, and to the central bond pads 126 of the second integrated circuit die 104. It is understood that other methods may be used to form the channels 136, such as holes and patterns.

Figure 9:
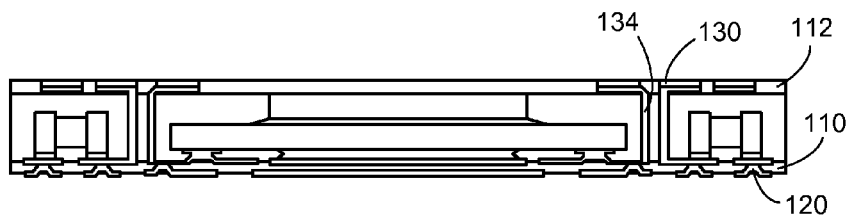
FIG. 9 is the structure of FIG. 8 in a plating phase.

Referring now to FIG. 9, therein is the structure of FIG. 8 in a plating phase. Conductive material, such as copper, is plated, forming the first terminal pads 120, the second terminal pads 130, and the electrical vias 134. Other materials may optionally be coated on the first terminal pads 120 and the second terminal pads 130 for protection or improved bonding surface. A solder resist is applied on the first structure 110 and the second structure 112 while leaving the first terminal pads 120 and the second terminal pads 130 exposed.

Figure 10:
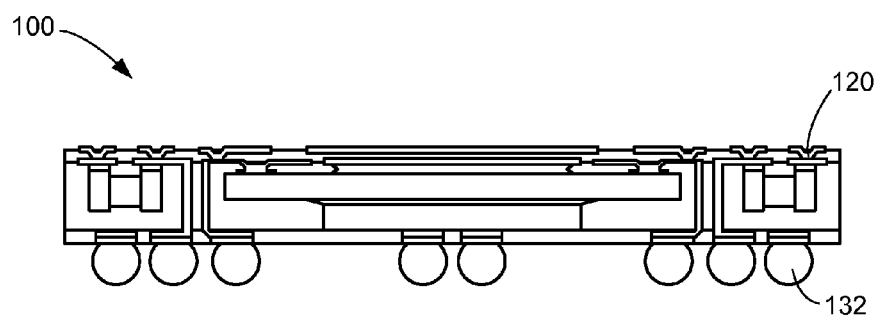
FIG. 10 is the structure of FIG. 9 in a solder ball mount phase.

Referring now to FIG. 10, therein is the structure of FIG. 9 in a solder ball mount phase. This phase is optional for embedding integrated circuits in a package used in an electronic system, such as a printed circuit board. The external interconnects 132, such as solder ball, are reflowed on the first terminal pads 120. Laser marking may optionally be performed placing identification information on the structure. The structure undergoes singulation forming the first embedded integrated circuit package system 100.

Figure 11:
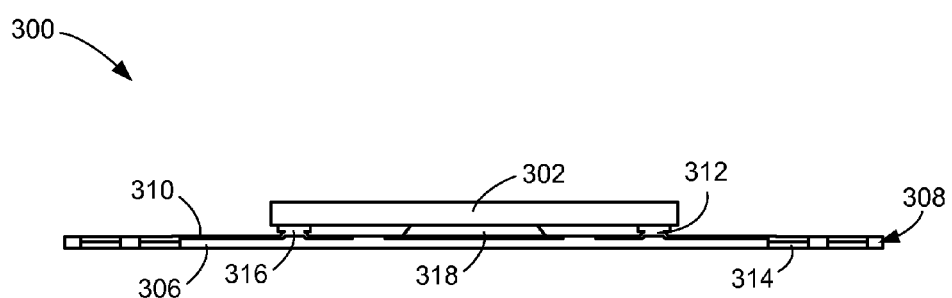
FIG. 11 is a cross-sectional view of the third embedded integrated circuit package system of FIG. 3 in a device-attach phase.

Referring now to FIG. 11, therein is shown a cross-sectional view of the third embedded integrated circuit package system 300 of FIG. 3 in a device-attach phase. The structure 306 has the conductive pattern 308 thereon. The conductive pattern 308 includes the traces 310 for routing signals, the contacts 312 for mounting devices, and the support 318 for the integrated circuit die 302. The integrated circuit die 302 mounts on the conductive pattern 308 with the bumps 316 connected on the contacts 312 then cured. The conductive pattern 308 also connects to the interior portion of the integrated circuit die 302. The terminal pads 314 expose the conductive pattern 308 to ambient through the structure 306 in a predetermined configuration.

Figure 12:
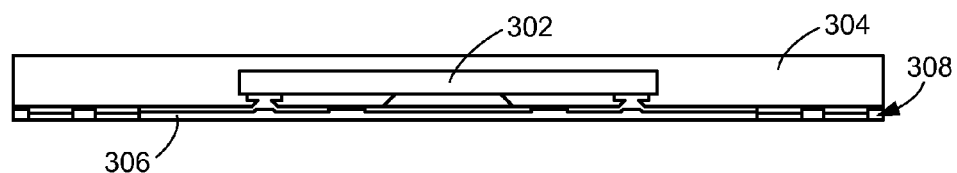
FIG. 12 is the structure of FIG. 11 in a substrate forming encapsulation phase.

Referring now to FIG. 12, therein is the structure of FIG. 11 in a substrate forming encapsulation phase. The low CTE encapsulant, the liquid substrate, flows to surround and cover the integrated circuit die 302 on the structure 306 forming the substrate forming encapsulation 304. The substrate forming encapsulation 304 also covers the conductive pattern 308.

Figure 13:
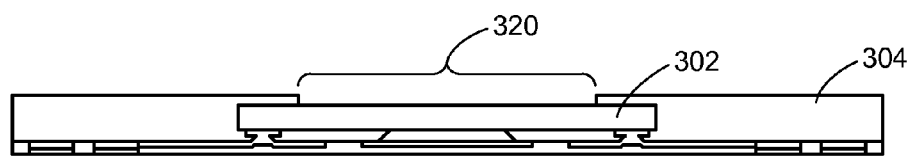
FIG. 13 is the structure of FIG. 12 in a drilling phase.

Referring now to FIG. 13, therein is the structure of FIG. 12 in a drilling phase. Laser drill forms the opening 320 in the substrate forming encapsulation 304 exposing a portion of the non-active side of the integrated circuit die 302. It is understood that other methods may be used to form the opening 320.

Figure 14:
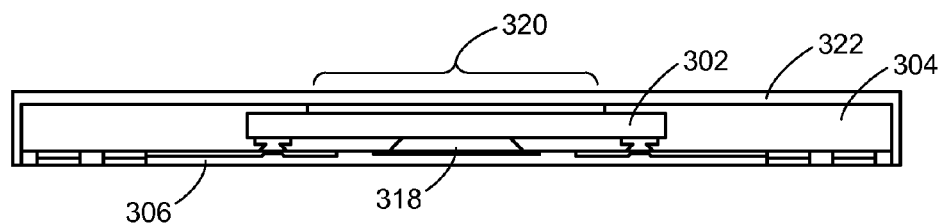
FIG. 14 is the structure of FIG. 13 in a plating phase.

Referring now to FIG. 14, therein is the structure of FIG. 13 in a plating phase. Conductive material, such as copper, is plated filling the opening 320 and forming the heat slug 322 on the integrated circuit die 302. The heat slug 322 covers the substrate forming encapsulation 304 exception the side with the structure 306. The support 318 prevents warpage or damage to the integrated circuit die 302.

Figure 15:
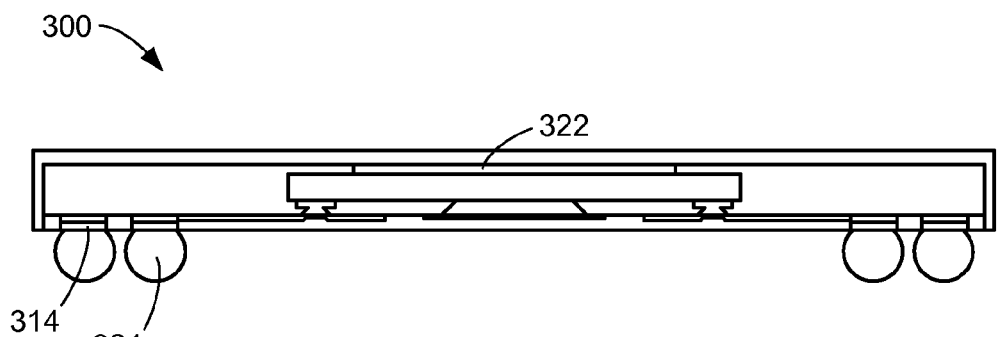
FIG. 15 is the structure of FIG. 13 in a solder ball mount phase.

Referring now to FIG. 15, therein is the structure of FIG. 13 in a solder ball mount phase. This phase is optional for embedding integrated circuits in a package used in an electronic system as a printed circuit board. The external interconnects 324, such as solder ball, are reflowed on the terminal pads 314. Laser marking may optionally be performed for placing identification information on the heat slug 322. The structure undergoes singulation forming the third embedded integrated circuit package system 300.

Figure 16:
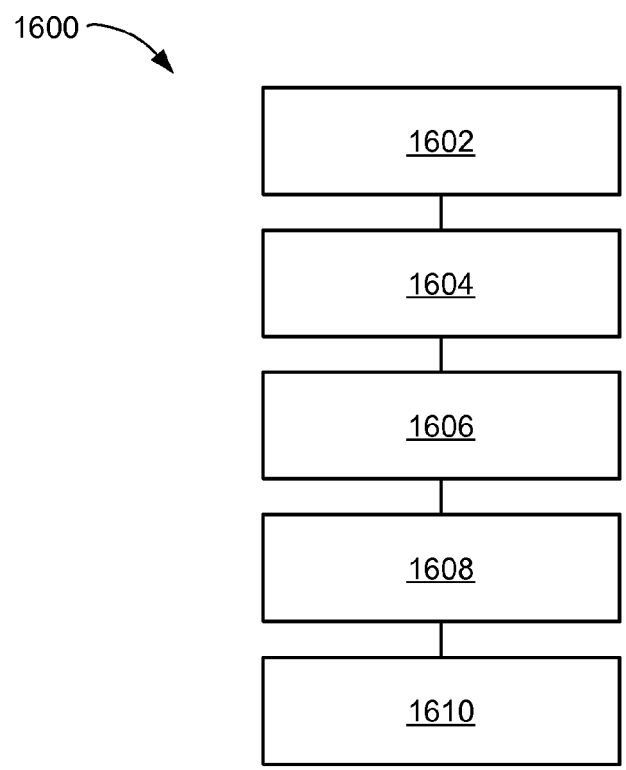
FIG. 16 is a flow chart of an embedded integrated circuit package system for manufacture of the embedded integrated circuit package system in an embodiment of the present invention.

Referring now to FIG. 16, therein is shown a flow chart of an embedded integrated circuit package system 1600 for manufacture of the embedded integrated circuit package system 100 in an embodiment of the present invention. The system 1600 includes forming a first conductive pattern on a first structure in a block 1602; connecting a first integrated circuit die on the first conductive pattern in a block 1604; forming a substrate forming encapsulation to cover the first integrated circuit die and the first conductive pattern in a block 1606; forming a channel in the substrate forming encapsulation in a block 1608; and applying a conductive material in the channel in a block 1610.

It has been discovered that the present invention thus has numerous aspects.

It has been discovered that the present invention provides a package system for embedding integrated circuits as well as other components in a low CTE encapsulant. The resulting package system allows integrated circuits, especially ultra thin integrated circuits, to be embedded while eliminating or reducing damage to the embedded integrated circuits.

An aspect is that the present invention provides a package system for integrated circuits to function as a conventional printed circuit board or equivalent structure on a electronic system where other devices may be mounted thereon as well as function as an integrate circuit package. This reduces real estate of the electronic system, simplifies manufacturing processes, reduces the package height, and reduces overall package as well as electronic system cost.

Another aspect of the present invention provides system performance with the embedded components, circuits, and structures. Metallization in the low CTE substrate forming encapsulation may be used to form signal traces, EM shields, passive circuits, or heat slugs, to name a few. Portions of the embedded metallization may be exposed for connection to other devices or for solder ball attachment.

Yet another aspect of the present invention provides shorter signal paths between the embedded devices to further improve system performance and lower system power consumption.

Yet another aspect is that the present invention provides electrical vias that may be formed in an oblique angle with the embedded traces by laser via drilling. This oblique via to embedded trace junction configuration improves signal integrity and system performance, especially for high speed signals by reducing signal reflections back to the driver source.

Yet another aspect is that the low CTE substrate forming encapsulation provides a uniform cover to the embedded integrated circuits and other components to minimize damage to the embedded integrated circuits and the other parts of the package structure. The composition of the low CTE encapsulant may be adjusted as needed.

Thus, it has been discovered that the embedded integrated circuit package system method of the present invention furnishes important and heretofore unknown and unavailable solutions, capabilities, and functional aspects for improving yield, reliability, and performance in systems. The resulting processes and configurations are straightforward, cost-effective, uncomplicated, highly versatile and effective, can be implemented by adapting known technologies, and are thus readily suited for efficiently and economically manufacturing embedded integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an embedded integrated circuit package system comprising:
   forming a first conductive pattern on a first structure;
   connecting a first integrated circuit die, having bumps on a first active side, directly on the first conductive pattern by the bumps;
   forming a substrate forming encapsulation to cover the first integrated circuit die and the first conductive pattern;
   forming a channel in the substrate forming encapsulation to the first integrated circuit die;
   applying a conductive material in the channel that forms a heat slug on the first integrated circuit die; and
   forming a terminal pad with a portion of the first conductive pattern exposed.

2. The method as claimed in claim 1 further comprising:
attaching a second structure on the substrate forming encapsulation;
wherein:
forming the channel in the substrate forming encapsulation comprises:
forming the channel between the second structure and the first conductive pattern; and
applying the conductive material in the channel further comprises:
forming a second conductive pattern exposed through the second structure, and
forming an electrical via between the first conductive pattern and the second conductive pattern.

3. The method as claimed in claim 1 further comprising:
attaching a second structure on the substrate forming encapsulation;
forming a terminal pad from a portion of the first conductive pattern exposed through the first structure;
mounting a component on the terminal pad; and
wherein:
forming the channel in the substrate forming encapsulation comprises:
forming the channel between the second structure and the first conductive pattern; and
applying the conductive material in the channel further comprises:
forming a second conductive pattern exposed through the second structure, and
forming an electrical via between the first conductive pattern and the second conductive pattern.

4. The method as claimed in claim 1 further comprising:
connecting a component on the first conductive pattern;
stacking a second integrated circuit die on the first integrated circuit die;
attaching a second structure on the substrate forming encapsulation;
forming a terminal pad from a portion of the first conductive pattern exposed through the first structure; and
wherein:
forming the channel in the substrate forming encapsulation comprises:
forming the channel between the second structure and the first conductive pattern; and
applying the conductive material in the channel further comprises:
forming a second conductive pattern exposed through the second structure, and
forming an electrical via between the first conductive pattern and the second conductive pattern.

5. A method of manufacture of an embedded integrated circuit package system comprising:
forming a first conductive pattern, with a contact, on a first structure;
connecting a first integrated circuit die, having bumps on a first active side, directly on the contact by the bumps;
molding a substrate forming encapsulation to cover the first integrated circuit die and the first conductive pattern;
forming a channel in the substrate forming encapsulation;
plating a conductive material in the channel;
forming a terminal pad with a portion of the first conductive pattern exposed; and
attaching an external interconnect on the terminal pad.

6. The method as claimed in claim 5 wherein forming the first conductive pattern comprises:
forming a support on the first integrated circuit die;
forming a contact having the first integrated circuit die thereon; and
forming a trace to connect the first integrated circuit die.

7. The method as claimed in claim 5 wherein applying the conductive material in the channel includes forming a vertical shield in the substrate forming encapsulation.

8. The method as claimed in claim 5 further comprising:
attaching a second structure on the substrate forming encapsulation;
wherein:
applying the conductive material in the channel further comprises:
forming a second conductive pattern exposed through the second structure; and
connecting an external interconnect to the second conductive pattern.

9. An embedded integrated circuit package system comprising:
a first conductive pattern on a first structure;
a first integrated circuit die, having bumps on a first active side, coupled directly on the first conductive pattern by the bumps;
a substrate forming encapsulation to cover the first integrated circuit die and the first conductive pattern;
a channel in the substrate forming encapsulation to the first integrated circuit die;
a conductive material in the channel that forms a heat slug on the first integrated circuit die; and
a terminal pad with a portion of the first conductive pattern exposed.

10. The system as claimed in claim 9 further comprising:
a second structure on the substrate forming encapsulation;
wherein:
the channel in the substrate forming encapsulation comprises:
the channel between the second structure and the first conductive pattern; and
the conductive material in the channel further comprises:
a second conductive pattern exposed through the second structure, and
an electrical via between the first conductive pattern and the second conductive pattern.

11. The system as claimed in claim 9 further comprising:
a second structure on the substrate forming encapsulation;
a terminal pad with a portion of the first conductive pattern exposed through the first structure;
a component on the terminal pad; and
wherein:
the channel in the substrate forming encapsulation comprises:
the channel between the second structure and the first conductive pattern; and
the conductive material in the channel further comprises:
a second conductive pattern exposed through the second structure, and
an electrical via between the first conductive pattern and the second conductive pattern.

12. The system as claimed in claim 9 further comprising:
a component on the first conductive pattern;
a second integrated circuit die on the first integrated circuit die;
a second structure on the substrate forming encapsulation;
a terminal pad from a portion of the first conductive pattern exposed through the first structure; and
wherein:
the channel in the substrate forming encapsulation comprises:

the channel between the second structure and the first conductive pattern; and the conductive material in the channel further comprises:
   a second conductive pattern exposed through the second structure, and
   an electrical via between the first conductive pattern and the second conductive pattern.

13. The system as claimed in claim 9 wherein:
the first conductive pattern on the first structure includes a contact;
the first integrated circuit die on the first conductive pattern is on the contact;
the substrate forming encapsulation to cover the first integrated circuit die and the first conductive pattern is a low coefficient of thermal expansion substrate forming encapsulation;
the channel in the substrate forming encapsulation is a connection channel; and
the conductive material in the channel is a metal or alloy.

14. The system as claimed in claim 13 wherein the first conductive pattern comprises:
   a support on the first integrated circuit die;
   a contact having the first integrated circuit die thereon; and
   a trace to connect the first integrated circuit die.

15. The system as claimed in claim 13 wherein the conductive material in the channel includes a vertical shield in the substrate forming encapsulation.

16. The system as claimed in claim 13 further comprising:
   a terminal pad with a portion of the first conductive pattern exposed; and
   an external interconnect on the terminal pad.

17. The system as claimed in claim 13 further comprising:
   a second structure on the substrate forming encapsulation; wherein:
      the conductive material in the channel further comprises:
         a second conductive pattern exposed through the second structure; and
         an external interconnect to the second conductive pattern.

* * * * *